United States Patent [19]
Fleury et al.
[11] Patent Number: 4,837,522
[45] Date of Patent: Jun. 6, 1989

[54] NOISE REDUCER FOR MICROWAVE AMPLIFIER

[75] Inventors: Georges Fleury, Gif Sur Yvette; Bernard Epsztein, Sceaux, both of France

[73] Assignee: Thomson CSF, Paris, France

[21] Appl. No.: 197,320

[22] Filed: May 23, 1988

[30] Foreign Application Priority Data

May 26, 1987 [FR] France ............................... 87 07417

[51] Int. Cl.[4] ............................................... H03F 1/26
[52] U.S. Cl. ...................................................... 330/149
[58] Field of Search ....................... 330/149, 294, 151; 370/32

[56] References Cited

U.S. PATENT DOCUMENTS 2,970,276 7/1983 Dollinger .
4,520,476 5/1985 Searl .

FOREIGN PATENT DOCUMENTS 733358 7/1955 United Kingdom .

*Primary Examiner*—Gene Wan
*Attorney, Agent, or Firm*—Oblon, Fisher, Spivak, McClelland & Maier

[57] ABSTRACT

In a noise reducer for microwave amplifiers working by pulses, a small portion of the amplifier output signal is diverted through an ancillary channel. The amplitude of the pulses of this diverted signal is greatly reduced by a limiter. The noise between the pulses can then be processed in an amplifying circuit and in a phase-shifting circuit so that, by combining the main signal in a second coupler, the noise between the pulses is eliminated. This invention can be applied to transmission amplifiers forming part of a transmission/reception set where reception takes place between the transmission pulses.

2 Claims, 1 Drawing Sheet

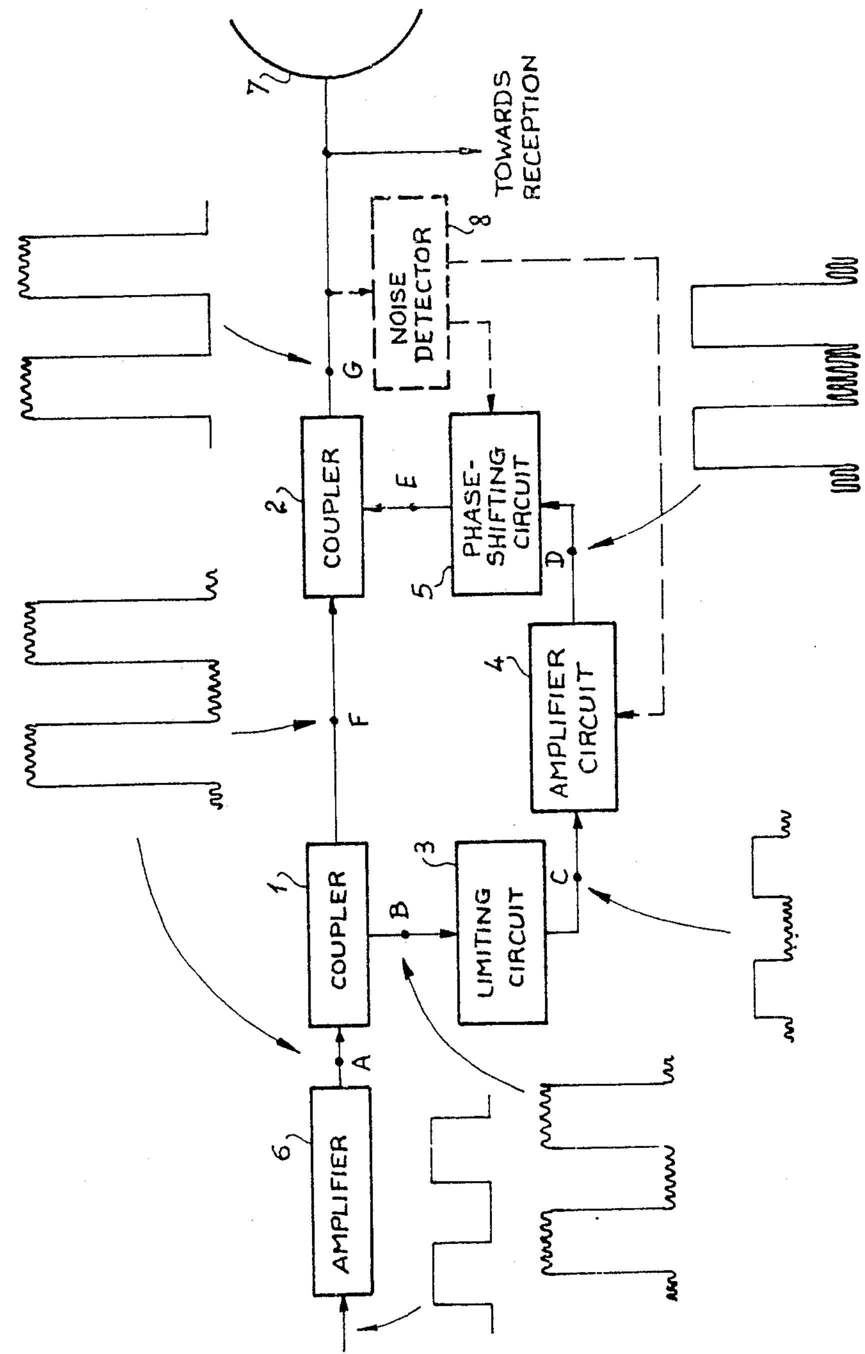
AMPLIFIER
COUPLER
COUPLER
LIMITING CIRCUIT
AMPLIFIER CIRCUIT
PHASE-SHIFTING CIRCUIT
NOISE DETECTOR
TOWARDS RECEPTION
A
B
C
D
E
F
G
1
2
3
4
5
6
7
8

NOISE REDUCER FOR MICROWAVE AMPLIFIER

BACKGROUND OF THE INVENTION

1. Field of the Invention

The present invention relates to a noise-reducing assembly (or noise reducer) for microwave amplifiers working by pulses. It also relates to an amplifier/antenna link comprising at least one assembly of this type.

2. Description of the Prior Art

The noise created by amplifiers at their output is greater than or equal to the product of the thermal noise at the input of the amplifier by the noise factor of the amplifier and by the gain of the amplifier. Thus, for example, a power amplifier microwave tube with a noise factor of 30 to 40 dB and a gain of 50 dB has a noise, at its power output, which is at least 80 to 90 dB greater than the thermal noise. Should an element constituting a noise source be placed before the amplifier, the noise output at the output of the amplifier is even greater.

In certain applications, when the amplifier is coupled to an antenna used for both transmission and reception, the noise created by the microwave tube may hamper the reception of the signals received at low levels, for there is an unwanted coupling between the power amplifier and the receiver. When transmission and reception do not take place in the same frequency band, a selective filter may be used, preferably in the reception channel, in order to remove the noise. This is not possible when transmission and reception occur sequentially in time, i.e. when the transmission is done in pulses, one signal being transmitted during the pulses and the reception taking place during the transmission "silent periods". There is a known means here for reducing the noise level during the silent periods: the electronic beam of the amplifier tube is cut off, for example by using a grid controlled at low level. Then, there is practically no more noise at the output, and consequently, reception is no longer hampered.

This method, which is very effective, nevertheless has disadvantages. It presupposes the use of a tube with a grid and of a grid controlling modulator. This results in higher costs and reduces the reliability and lifetime of equipment.

SUMMARY OF THE INVENTION

An aim of the present invention is to reduce noise during the silent periods without resorting to controlled grids.

This is got by diverting a small portion of the amplifier output signal and processing it, in amplitude and phase, so that, by then combining this portion with the other portion of the amplifier output signal, it becomes possible to remove noise during silent periods.

According to the invention, there is provided a noise reducer for an microwave amplifier, working in pulses, said noise reducer comprising a first coupler with an input to be coupled to the amplifier, a main output and and ancillary output; a second coupler having a main input coupled to the main output of the first coupler, an ancillary input and an output constituting the output of the noise reducer; and, series-connected between the ancillary output of the first coupler and the ancillary input of the second coupler, a voltage limiting circuit, an amplifier circuit and a phase-shifting circuit, wherein the first coupler and second coupler having respective coupling coefficients C1 and C2, the amplifier circuit has a gain Ga which is at least substantially equal to the sum C1+C2 and wherein the phase-shifting circuit is adjusted so that, between the working pulses of the amplifier, the signals reaching the two inputs of the second coupler are combined in phase opposition in the second coupler.

BRIEF DESCRIPTION OF THE DRAWING

The present invention will be better understood and its other features will be seen from the following description and the appended FIGURE which shows an amplifier for microwave transmission coupled to an antenna by means of a noise reducer according to the invention.

MORE DETAILED DESCRIPTION

The figure shows an amplifier 6, constituted by an microwave tube. This amplifier is designed to amplify an microwave signal to be transmitted by an antenna 7. The input signal of the amplifier as well as various other signals of the assembly have been shown in the figure. In the drawings of these signals, the amplitudes are not represented with precision. Some of these signals correspond to power values of 1 kW and others to power values of a few tens of milliwatts.

The signal to be amplified is made up of pulses and, between these pulses, a reception circuit connected to the antenna 7 should be capable of reception.

The output of the amplifier 1 (reference A) is connected to the input of a directional coupler 1, the main output or high-level output (reference F) of which is connected to the main input of another directional coupler 2, and the ancillary output or low-level output (reference B) of which is connected to the input of a voltage limiting circuit 3, the output (reference C) of which is connected to the input of an amplifier circuit 4.

The output (reference D) of the amplifier circuit 4 is connected to the input of a phase shifting circuit 5, the output (reference E) of which is connected to the ancillary input of a directional coupler 2.

The output (reference G) of the coupler 2 is connected to the antenna 7 port, and a link goes from this port to a receiver which is not shown in the figure.

In the embodiment used to illustrate the present description, the microwave output power of the amplifier 6 is 1 kW, namely 60 dBm, the 3 dB band of this amplifier is about 1000 Mhz, its noise factor is about 40 dB and its gain is close to 50 dB. Thus, the noise level at A, namely at the output of the amplifier, is about +5 dBm.

Since the coupler 1 has a coupling coefficient (namely a power ratio in transmission between its input and its ancillary output) of C1=30 dB, practically all the power given by the amplifier 6 is transmitted by the main output of this coupler on the direct channel which reaches the coupler 2 through F. By contrast, in the diverted channel, namely the channel passing through the circuits 3, 4 and 5, in B, the useful signal has a level of 60 dBm−C1=30 dBm, and the noise level is 5 dBm−C1=−25 dBm.

In the example described, the threshold of the limiting circuit 3 is set at 10 dB above the mean level of the noise. Hence, in C, the signal has a level of 5 dBm−C1+10 dB=−15 dBm, while the noise, which is below the limit, retains its value, namely 5 dBm−C1=25 dBm.

The amplifier circuit 4 has a gain Ga equal to C1+C2 where C2 is the coupling coefficient of the coupler 2. In the example described C2=C1=30 dB. Hence, in D, the useful signal has a level of 15 dBm+C2=45 dBm, and the noise reaches 5 dBm+C2=35 dBm.

The phase-shifting circuit 5 is set so that, inside the coupler 2, the noise signals coming from the direct channel and those coming from the diverted channel are combined in phase opposition. Since they have substantially the same amplitude of 5 dBm at the instant when they are combined, they cancel each other. Thus, the noise is eliminated between the microwave pulses while the useful signal is practically undisturbed since its level in E is very low compared with the useful signal in the direct channel.

It must be noted that the noise reduction obtained by assemblies of the type just described is about 10 to 20 dB depending on the operating band width at microwave frequencies.

The present invention is not restricted to the example described herein. This is how, in particular, the threshold of the limiting circuit 3 may be set differently depending on the microwave band from which the noise has to be eliminated. Similarly, the limiting function of the circuit 3 may be associated, in one and the same circuit, with the circuit 4 amplifying function, it being understood that the amplifying function should always be performed with a low noise factor so as not to create any unwanted signal that might affect the noise signal that comes from the amplifier 6 and is transmitted by the diverted channel.

If the noise reduction obtained with an assembly such as the one just described is not sufficient, several assemblies of this type may be connected in series between the amplifier and the antenna.

Furthermore, the assembly that has just been described may be complemented so as to work in a closed loop, as shown with broken lines in the figure. For this, a noise detector 8 measures the amplitude and phase of the noise signal in G, outside the microwave operating band, and reacts on the amplification factor of the circuit 4 and on the phase of the circuit 5 so that it tends to cancel the noise thus measured.

What is claimed is:

1. A noise reducer for microwave amplifiers, working in pulses, said noise reducer comprising a first coupler having an input to be coupled to the amplifier, a main output and an ancillary output; a second coupler having a main input coupled to the main output of the first coupler, an ancillary input and an output constituting the output of the noise reducer; and, series-connected between the ancillary output of the first coupler and the ancillary input of the second coupler, a voltage limiting circuit, an amplifier circuit and a phase-shifting circuit, wherein the first coupler and second coupler having respective coupling coefficients C1 and C2, the amplifier circuit has a gain Ga which is at least substantially equal to the sum C1+C2, and wherein the phase-shifting circuit is adjusted so that, between the working pulses of the amplifier, the signals reaching the two inputs of the second coupler are combined in phase opposition in the second coupler.

2. A noise reducer according to claim 1 comprising a noise detector coupled to the output of the second coupler to control the gain of the amplifier circuit and the phase shift of the phase-shifting circuit.

* * * * *